United States Patent [19]

Pankove

[11] Patent Number: 5,263,041
[45] Date of Patent: Nov. 16, 1993

[54] SURFACE EMITTING SEMICONDUCTOR LASER

[75] Inventor: Jacques I. Pankove, Boulder, Colo.

[73] Assignee: The University of Colorado Foundation, Inc., Boulder, Colo.

[21] Appl. No.: 858,836

[22] Filed: Mar. 27, 1992

[51] Int. Cl.⁵ .............................................. H01S 3/19
[52] U.S. Cl. ......................................... 372/45; 372/96
[58] Field of Search ................................. 372/96, 45

[56]                References Cited
U.S. PATENT DOCUMENTS

| 4,162,460 | 7/1979 | Gonda | 372/50 |
|---|---|---|---|
| 4,503,540 | 3/1985 | Nakashima et al. | 372/47 |
| 4,594,603 | 6/1986 | Holonyak, Jr. | 357/16 |
| 4,630,083 | 12/1986 | Yamakoshi | 372/45 |
| 4,660,207 | 4/1987 | Svilans | 372/45 |
| 4,665,527 | 5/1987 | Akiba et al. | 372/96 |

FOREIGN PATENT DOCUMENTS

| 0010685 | 1/1985 | Japan | 372/96 |
|---|---|---|---|
| 0083389 | 5/1985 | Japan | 372/45 |
| 0145693 | 8/1985 | Japan | 372/96 |
| 8911173 | 11/1989 | PCT Int'l Appl. | 372/45 |

OTHER PUBLICATIONS

Article Titled "Efficient, High-Power (>150 mW) Grating Surface Emitting Lasers" By G. A. Evans, et al., *Applied Physics Letters*, Mar. 1988, #52(13), pp. 1037–1039.
Article Titled "Coherent, Monolithic Two-Dimensional (10×10) Laser Arrays Using Grating Surface Emission" By G. A. Evans et al., Applied Physics Letters, Nov. 1988, #53 (22), pp. 2123–2125.
Article Titled "Low-Threshold Electrically Pumped Vertical-Cavity Surface-Emitting Microlasers" By J. L. Jewell et al., *Electronics Letters*, Aug. 1989, vol. 25, No. 17, pp. 1123–1124.
Article Titled "Top-Surface-Emitting GaAs Four-Quantum-Well Lasers Emitting at 0.85 um" By Y. H. Lee et al, *Electronics Letters*, May 1990, vol. 26, No. 11, pp. 710–711.
Article Titled "Fabrication of Microlasers and Microresonator Optical Switches" By A. Scherer et al., *Applied Physics Letters*, Dec. 1989, #55 (26), pp. 2724–2726.

*Primary Examiner*—Georgia Y. Epps
*Attorney, Agent, or Firm*—Donald S. Cohen; Earl C. Hancock

[57]            ABSTRACT

A surface emitting semiconductor laser includes a body of a semiconductor material having a pair of opposed surfaces and a plurality of active regions stacked one on the other between the surfaces. Each of the active regions includes a p-type conductivity layer, an n-type conductivity layer and an active layer therebetween. The active layer can either be intrinsic or a quantum well. The p-type and n-type layers are doped to provide a tunneling junction between the layers of adjacent active regions. The active layers of the active regions are spaced apart a multiple of one-half a wavelength to provide distributed feedback. Contacts are on the surfaces of the body with one of the contacts having an opening therethrough through which a generated light beam can emerge.

22 Claims, 2 Drawing Sheets

SURFACE EMITTING SEMICONDUCTOR LASER

FIELD OF THE INVENTION

The present invention relates to a semiconductor laser, and, more particularly to a surface emitting semiconductor laser.

BACKGROUND OF THE INVENTION

Semiconductor devices which are capable of generating and emitting light are generally categorized as light-emitting diodes and lasers. The light-emitting diodes generally emit non-coherent light whereas lasers emit substantially coherent beams of light. In general, each of these semiconductor light-emitting devices comprises a body of a semiconductor material having layers of opposite conductivity type forming a PN junction which extends to an edge of the body. Light emitting diodes have been developed which emit light either from a surface of the body (surface emitting diodes) or from an edge of the body (edge emitting diodes). However, initially, semiconductor lasers were only edge-emitting lasers. This resulted from the fact that to achieve a substantially coherent beam of light, the device requires a gain region, the forward biased PN junction, and a waveguide having spaced reflecting means for achieving the necessary feedback of the generated light to achieve coherence. The waveguide was generally formed along the PN junction between the edges of the body with the reflecting means, such as mirrors, being formed at opposite edges of the body. A disadvantage of the edge-emitting laser is that the emitting area is small resulting in a beam having a relatively large divergence angle. In order to reduce the divergence angle of the emitted beam, and thus achieve a more collimated beam of light, it is desirable to have a large opening through which the beam is emitted from the device. A surface-emitting device would provide such a larger opening.

Several attempts have been made to form surface emitting lasers. One attempt is a microlaser which is described in the articles "Low Threshold Electrically Pumped Vertical-Cavity Surface-Emitting Microlasers" by J. L. Jewell et al, *Electronic Letters*, Vol. 25, 1989, pg. 1123, "Top Surface Emitting GaAs Four-Quantum-Well Lasers Emitting at 0.85 um", by Y. H. Lee et al, *Electronic Letters*, Vol 26, 1990, pg. 710, and "Fabrication of Microlasers and Microresonator Optical Switches" by A. Scherer et al., *Applied Physics Letters*, Vol. 55, 1989, pg. 2724. In the microlaser, a few quantum wells are placed at the center of a one wavelength long cavity sandwiched between two stacks of quarter-wave interference mirrors. One of the stacks is doped n-type and the other is doped p-type to form a p-i-n junction. When the p-i-n junction is forward biased, double injection into the active region, which may contain quantum wells, results in radiative recombination. However, because the active region is so short, high quality mirrors must be fabricated to increase the number of passes the radiation must make through the inverted population to achieve threshold for lasing. The high reflectance of the mirrors reduces the power transmitted out of the device. Also, possible absorption and scattering losses reduce the external quantum efficiency.

Another type of surface emitting laser is the distributed-feedback graded-index, separate-confinement heterostructre (DFB GRINSCH). This type of laser is described in the articles "Efficient, High-Power (>150 mW) Grating Surface Emitting Lasers" by G. A. Evans et al, *Applied Physics Letters*, Vol. 52, 1988, pg. 1037 and "Coherent, Monolithic Two-Dimensional (10×10) Laser Arrays Using Grating Surface Emission" by G. A. Evans et al, *Applied Physics Letters*, Vol. 53, 1988, pg. 2123. This device includes a grating outside the active region within the plane of the pn junction. The grating couples the light transversely to the surface by second order diffraction. The extent of the grating outside the active region overcomes the aperture constraints of the edge-emitting laser in its worst direction, i.e. where the thinness of the junction causes the largest beam divergence. In the other direction, i.e. parallel to the grating ruling, the beam divergence is not changed and therefore is several degrees wide. However, this type of surface emitting laser is complex in structure and relatively large in size since the grating is outside of and to one end of the active region of the device in which the light is generated.

SUMMARY OF THE INVENTION

The surface emitting laser of the present invention includes a body of a semiconductor material having spaced surfaces. Within the body are a plurality of active region stacked one on the other between the surfaces of the body. Each of the active regions has means for generating light when a voltage is placed thereacross. The light generating means are spaced apart one-half of a wavelength to provide distributed feedback of the generated light so as to achieve phase coherence of the light beam which is emitted from one of the surfaces of the body.

DETAILED DESCRIPTION

Figure 1:
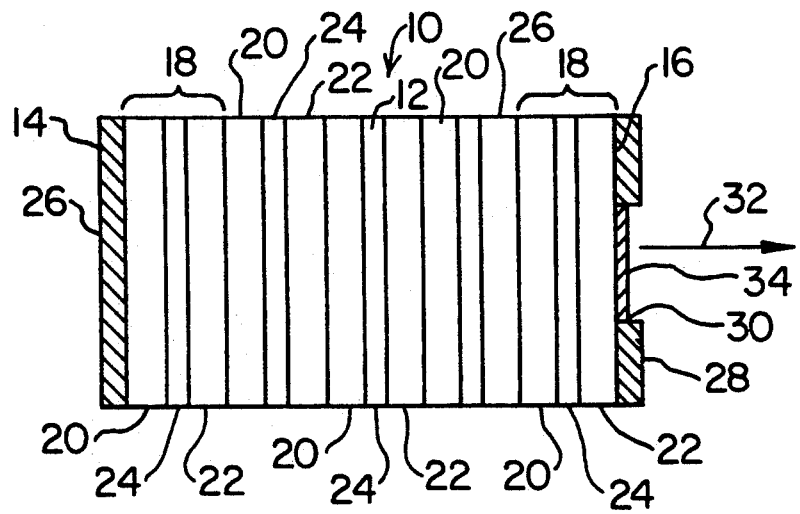
FIG. 1 is a sectional view of one form of the surface emitting laser of the present invention.
Figure 2:
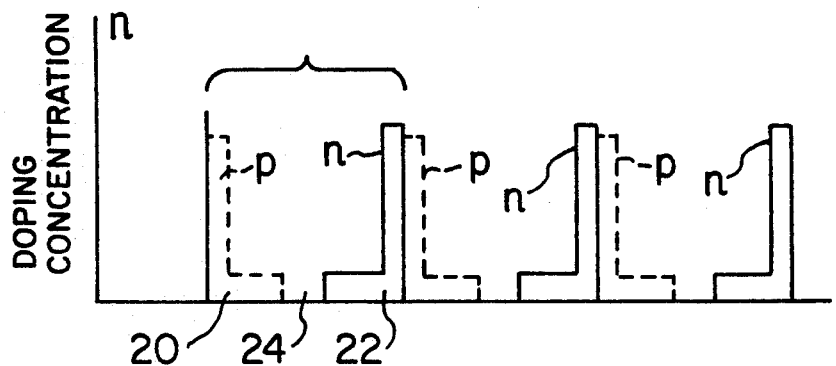
FIG. 2 is a graph of the doping profile in the laser shown in FIG. 1.

Referring initially to FIG. 1, there is shown a sectional view of one form of the surface emitting semiconductor laser 10 of the present invention. Laser 10 comprises a body 12 of a semiconductor material having opposed major surfaces 14 and 16. The body 12 is formed of a plurality of active regions 18 stacked on each other between the surfaces 14 and 16. Each active region 18 is formed of layers 20 and 22 of opposite conductivity type. Thus, each layer 20 is of p-type conductivity and each layer 22 is of n-type conductivity. As shown in FIG. 2, the doping concentration of the acceptors and donors in the layers 20 and 22 is such that the concentration rapidly extends to a maximum at the outer sides of each active region 18 and varies either gradually or stepwise downwardly to a point between the layers 20 and 22 to form an intrinsic layer 24 between the layers 20 and 22. The abrupt junctions provided between the p-type layers 20 and the n-type layers 22 of adjacent active regions 18 imparts a tunneling characteristic to these n-p junctions that are normally reverse biased. The gradual junction with the intrinsic layer 24 in each active region 18 provides for good light generation when the gradual junction is forward biased.

To improve the carrier confinement near each p-n junction the composition of the layers 20, 22 and 24 is such as to provide layers having different band-gaps. The p-type layers 20 should be of the widest band-gap material, the n-type layers 22 of a narrower band-gap material and the intrinsic layer 24 of the narrowest band-gap material. Examples of suitable groups of materials are GaAs and GaAlAs, GaAs and InGaAs, GaAs and GaAsP and GaAs and InGaP. A preferred groups of materials is GaAlAs for the p-type layers 20, GaAs for the n-type layers 22 and InGaAs for the intrinsic layers 24. The structure of the body 12 should be periodic with the spacing between the intrinsic layers 24 being a mulitple of one-half a wavelength. The actual spacing can be determined by the following:

Spacing = m λ/2n where m is an integer, λ is the radiation wavelength in vacuum, and n is the average refractive index of the semiconductor material. Choosing m=1, the periodicity is on the order of about 100 nm. The purpose of the periodic structure is to provide periodic Bragg scattering so that the backward wave can couple to the forward wave and induce a common coherence, resulting in laser output. A conductive contact 26 is on the surface 14 of the body 12 and a conductive contact 28 is on the surface 16. The contact 28 has an opening 30 therethrough through which the emitted beam of light, indicated by the arrow 32, can pass. An anti-reflection coating 34 is on the portion of the surface 16 exposed by the opening 30 in the contact 28 to maximize the output power of the light emitted by the laser 10. Also, the thickness of the p-type layer 20 closest to the surface 14 should be optimized by adjusting its thickness between λ/2n and λ/4n.

Figure 3:
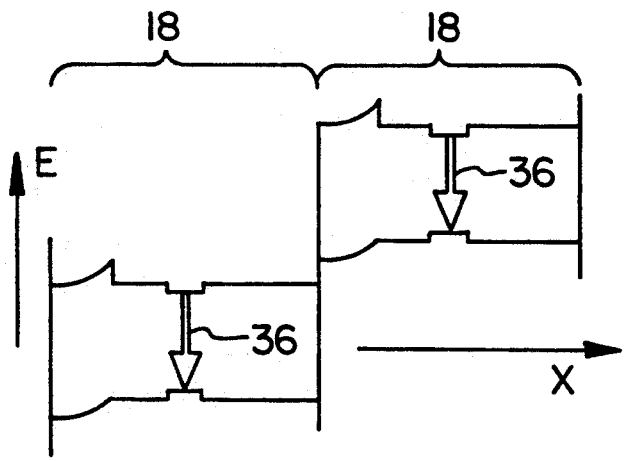
FIG. 3 is a graph showing the energy profile in a portion of the laser shown in FIG. 1.

In the operation of the surface emitting semiconductor laser 10, the contact 26 is connected to the positive side of a source of voltage and the contact 28 is connected to the negative side. This applies a bias to the body 12 − + such that the p-n junctions across the intrinsic layers 24 are forward-biased whereas the junctions between the layers 22 and 20 of adjacent active regions 18 are reversed-biased. The forward-biased junctions cause recombination in the intrinsic layers 24 resulting in the generation of light. However, the reverse-biased junctions are tunneling diodes as a result of the abrupt junctions thereacross. The tunneling diodes have a low resistance. Having the light generating junctions spaced one-half wavelength apart, provides the distributed feedback that is needed to generate phase coherence. By forming the body 12 with a plurality of the active regions 18, a high power gain is achieved. FIG. 3 shows the energy band diagram of an operating semiconductor laser 10. The heavy arrows 36 represent the radiative recombination in the active regions 18. Since the light is emitted from the surface 16 of the body 12, the opening 32, which provides the emitting aperture, can be large. This large aperture of the surface-emitting, distributed-feedback laser 10 produces a high-power, low dispersion beam of coherent light.

Figure 4:
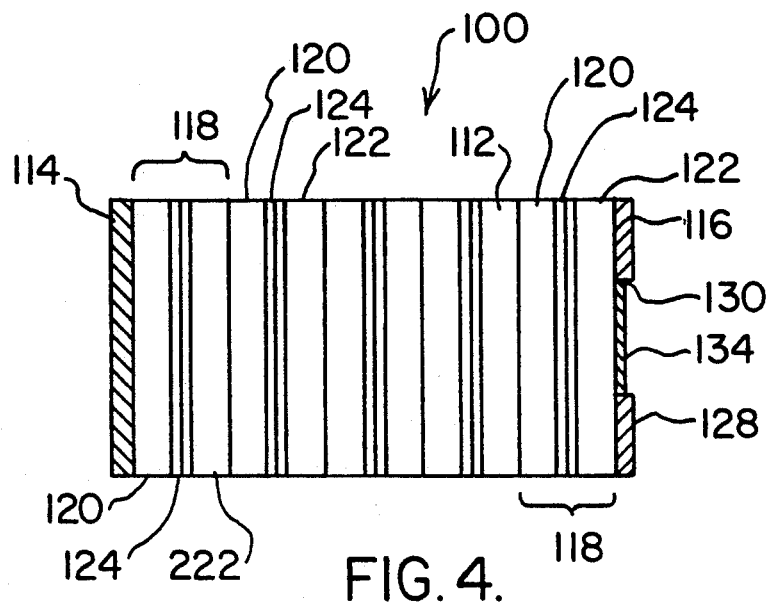
FIG. 4 is a sectional view of another form of the surface emitting laser of the present invention.

Referring to FIG. 4, there is shown another form of the surface emitting, semiconductor laser of the present invention, which is generally designated 100. Laser 100 comprises a body 112 of a semiconductor material having opposed surfaces 114 and 116. Within the body 112 and between the surfaces 114 and 116 are stacked a plurality of active regions 118. Each active region 118 has p-type layer 120, an n-type layer 122 and a layer 124 between the p-type layer 120 and n-type layer 122. The layer 124 is a quantum well region which may be a single quantum well, but is preferably a multi-quantum well, i.e., several closely spaced quantum wells.

A conductive contact 126 is on the surface 114 of the body 112 and a conductive contact 128 is on the surface 116. The contact 128 has an opening 130 therethrough through which the emitted beam of light can pass. An anti-reflection coating 134 is on the portion of the surface 116 exposed by the opening 130 in the contact 128.

Figure 5:
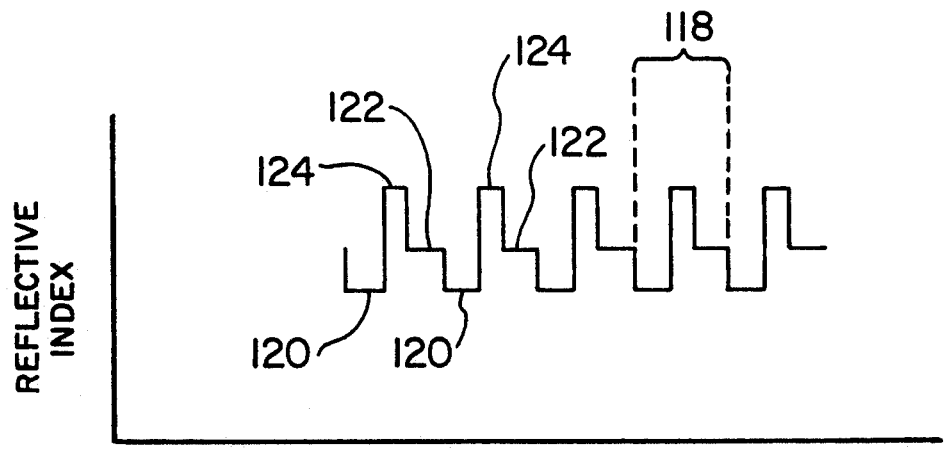
FIG. 5 is a chart showing the profile of the index of refraction in the laser shown in FIG. 4.

Each of the p-type layers 120 and each of the n-type layers 122 has a higher doping concentration along its side away from the quantum well layer 124. Thus the layers 120 and 122 are of p+ type and n+ type respectively along the sides away from the quantum well layer 124. This provides for the tunneling junction between the p-type layer 120 of one active region 118 and n-type layer 122 of the adjacent active region 118. Also, the layers 120 and 122 are of materials having different band-gaps. Thus, the layers 120 may be of GaAlAs and the layers 122 of GaAs. The quantum wells in layer 124 must be of a stil lower bandgap material, such as for example InGaAs. As shown in FIG. 5 this provides the body 112 with regions of different refractive index to achieve periodic Bragg reflection necessary for forming a substantially coherent beam of light. Also, the quantum well layers 124 are spaced apart an integral number of one-half a wavelength.

Thus, there is provided by the present invention a semiconductor laser which emits substantially coherent light from a surface thereof to allow for larger beam of light having smaller divergence angles. The laser has internal means for obtaining distributed feedback and includes a plurality of light generating regions for greater power.

What is claimed is:

1. A semiconductor surface emitting laser comprising:
    a body of a semiconductor material having a pair of spaced opposed surfaces;
    active regions in the body stacked one on the other between said surfaces, each of said active regions having means for generating light when a voltage is placed thereacross;
    the light generating means being spaced apart a multiple of one-half a wavelength to provide distributed feedback so as to impose phase coherence to the light beam which is emitted from said body through one of said surfaces; and
    a conductive contact on each of said opposed surfaces of the body.

2. The semiconductor laser in accordance with claim 1 in which the light generating means are spaced apart a integral number of one-half wavelengths.

3. The semiconductor laser in accordance with claim 1 in which each of the active regions includes a first layer of p-type conductivity and a second layer of n-type conductivity.

4. The semiconductor laser in accordance with claim 3 in which the junction between the first layer of each active region and the second layer of the next adjacent active region is a tunneling junction.

5. The semiconductor laser in accordance with claim 4 in which each of the layers of each active region has a high doping concentration along its junction with the layer of the next adjacent active region to form the tunneling junction.

6. The semiconductor laser in accordance with claim 5 in which the doping concentration in each of the layers increases rapidly toward the junction of the layer with the layer of the next adjacent active region.

7. The semiconductor laser in accordance with claim 6 in which the doping concentration of each layer decreases gradually from the highly doped portion toward the junction with the other layer of the respective active region.

8. The semiconductor laser in accordance with claim 3 including a third active layer between the first and second layers.

9. The semiconductor laser in accordance with claim 8 in which the third layer is intrinsic.

10. The semiconductor laser in accordance with claim 9 in which the junction between the first layer of each active region and the second layer of the next adjacent active region is a tunneling junction.

11. The semiconductor laser in accordance with claim 10 in which each of the first and second layers of each active region has a high doping concentration along its junction with the layer of the next adjacent active region to form a tunneling junction.

12. The semiconductor laser in accordance with claim 11 in which the doping concentration in each of the first and second layers increases rapidly toward the junction of the layer with the layer of the next adjacent active region.

13. The semiconductor laser in accordance with claim 12 in which the doping concentration of each of the first and second layers decreases gradually from the highly doped portion toward the third layer of the respective active region.

14. The semiconductor laser in accordance with claim 13 including an opening in one of the contacts to allow a beam of light to pass therethrough.

15. The semiconductor laser in accordance with claim 8 in which the third layer includes a quantum well.

16. The semiconductor laser in accordance with claim 15 in which the third layer includes several quantum wells.

17. The semiconductor laser in accordance with claim 15 in which the junction between the first layer of each active region and the second layer of the next adjacent active region is a tunneling junction.

18. The semiconductor laser in accordance with claim 17 in which the first and second layers of each active region have a high doping concentration at the junction with the layer of the next adjacent active region to provide the tunneling junction.

19. The semiconductor laser in accordance with claim 18 including contacts on each of the surfaces of the body and an opening in one of the contacts to allow a beam of light to pass therethrough.

20. The semiconductor laser in accordance with claim 19 includling an anti-reflection coating on the light exit surface of the laser.

21. The semiconductor laser in accordance with claim 3 in which the layer closest to the light emitting surface is of a thickness of between $\lambda/2n$ and $\lambda/4n$ so as to be optimized.

22. The semiconductor laser in accordance with claim 21 in which the optimized layer is of p-type conductivity.

* * * * *